United States Patent [19]

Yamasaki

[11] Patent Number: 4,486,717

[45] Date of Patent: Dec. 4, 1984

[54] PHASE CONTROLLED OSCILLATOR INCLUDING A PHASE LOCK LOOP AND DUAL SWEEP OSCILLATORS

[75] Inventor: Toyosaka Yamasaki, Tokyo, Japan

[73] Assignee: Nippon Electric Co., Ltd., Tokyo, Japan

[21] Appl. No.: 456,100

[22] Filed: Jan. 6, 1983

[30] Foreign Application Priority Data

Jan. 7, 1982 [JP] Japan .................................. 57-1656

[51] Int. Cl.³ .............................................. H03L 7/00
[52] U.S. Cl. ........................................ 331/4; 331/17; 331/25; 331/178
[58] Field of Search .................. 331/4, 17, 25, 178

[56] References Cited

U.S. PATENT DOCUMENTS

| | | | |
|---|---|---|---|
| 3,571,754 | 3/1971 | Healey et al. ....................... | 331/116 |
| 4,009,448 | 2/1977 | Hopwood et al. ..................... | 331/4 |
| 4,039,966 | 8/1977 | Skinner .................................. | 331/4 |
| 4,121,166 | 10/1978 | Matsumoto et al. ................ | 331/4 X |

OTHER PUBLICATIONS

"Phaselock Techniques" published by John Willey and Son, 1979.

Primary Examiner—Eugene R. LaRoche
Assistant Examiner—Robert J. Pascal
Attorney, Agent, or Firm—Blakely, Sokoloff, Taylor & Zafman

[57] ABSTRACT

A phase controlled oscillator comprises a first sweeping oscillator producing an output voltage controlled by a control input signal and a first sweeping signal within a limited output voltage amplitude, a second sweeping oscillator which produces a second sweeping signal having an amplitude smaller than that of the first sweeping signal supplied to a phase locked loop, the phase relation of input and output signals of the second sweeping oscillator being selected such that it stops oscillation when the loop is in a locked state, and a control circuit adapted to hold the output voltage of the first sweeping oscillator.

9 Claims, 4 Drawing Figures

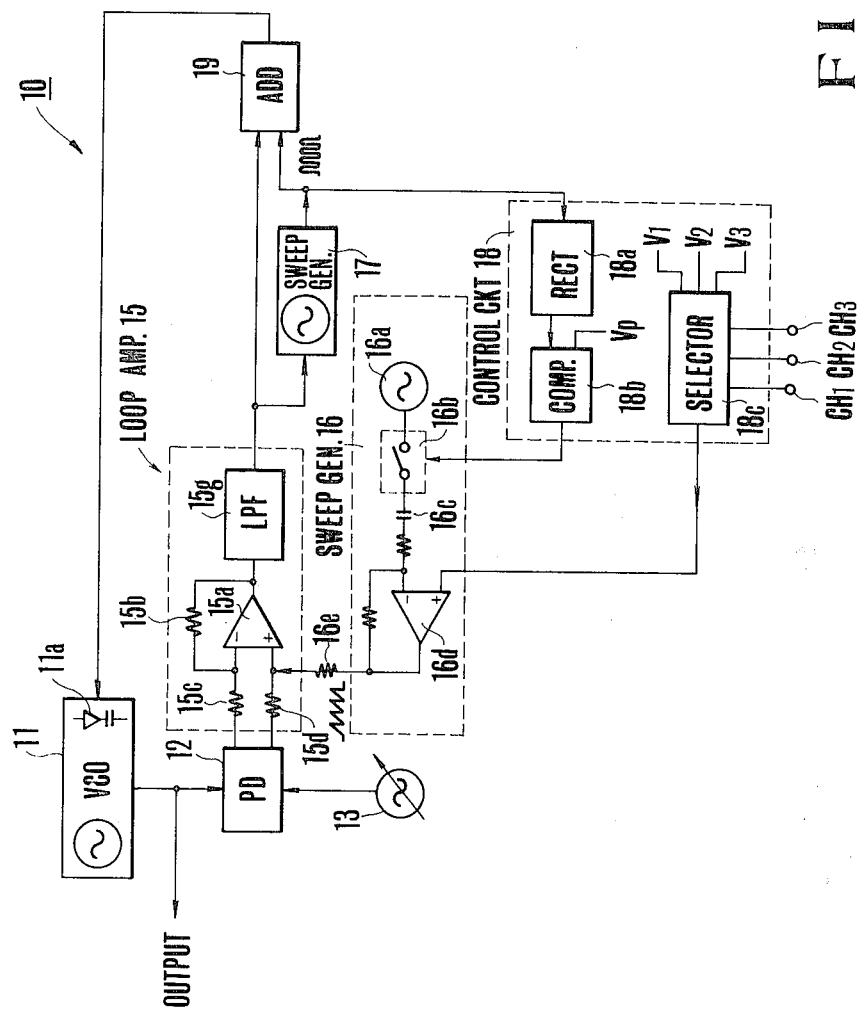
F I G. 1

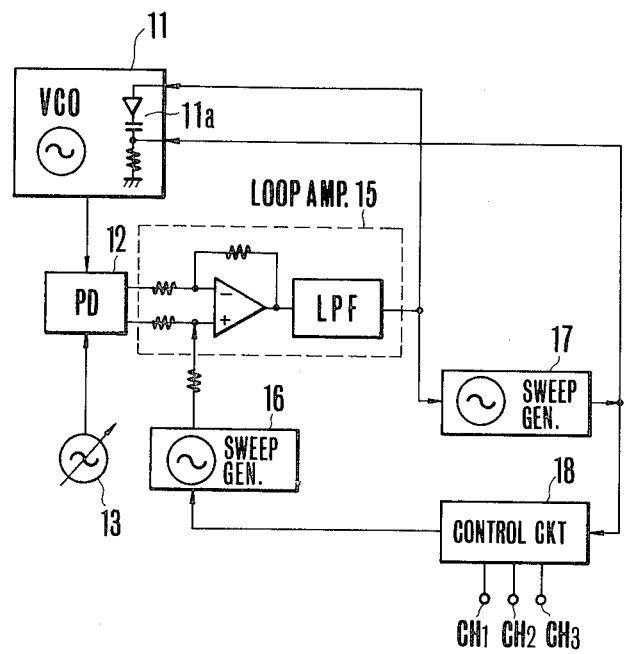
F I G. 2
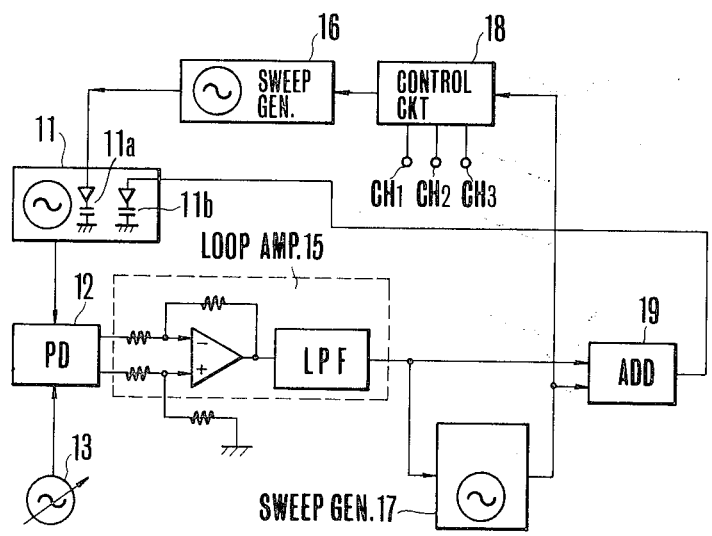
F I G. 3

PHASE CONTROLLED OSCILLATOR INCLUDING A PHASE LOCK LOOP AND DUAL SWEEP OSCILLATORS

BACKGROUND OF THE INVENTION

This invention relates to a phase controlled oscillator, and more particularly an improvement of a phase controlled oscillator in which the frequency of a voltage controlled oscillator is stabilized by an analogue phase locked synchronizing loop.

A prior art phase controlled oscillator is disclosed in U.S. Pat. No. 4,039,966 issued on Aug. 2, 1977, for example, in which the output of a voltage controlled oscillator whose phase is controlled by a varactor diode (trade name) is applied to one input of a comparator with the other input supplied with the output of a reference oscillator. The output of the phase comparator is applied to a loop amplifier and its output signal is supplied to a control input terminal of a voltage controlled oscillator.

With this construction, the loop amplifier operates as a sweeping oscillator until the loop reaches a synchronous state, so that the voltage of the varactor diode of the voltage controlled oscillator is scanned to be controlled in a pull-in range. As the synchronous state is reached the phase of the input signal to the amplifier becomes opposite to that of the output signal so that the amplifier stops to oscillate and acts as a loop amplifier. The phase locking function is well known in the art and disclosed, for example, in a text book of F. M. Gardner, "Phaselock Techniques" published by John Willy and Son, 1979.

Although this circuit can start automatically and can operate as an oscillation circuit operating stably, the hold-in range of the phase locked loop is narrower than a frequency changing range of the voltage controlled oscillator so that pull-in is possible only in a portion of the frequency changing range of the voltage controlled oscillator whereby the characteristic of the amplifier while it acts as a sweeping oscillator would be limited and it can not self-start under a condition other than the condition described above.

Where a plurality of channels are used as in a transponder used in a communication satelite, for example, the frequency range is extremely wide. For example, a reference frequency of 2 GHz requires a range of 100 MHz. However, the frequency range of the oscillator of the type referred to above is about 20 MHz, while the loop band or the locking range is at most 100 KHz. Thus in terms of the pull-in range or capture range the frequency range is about 1 to 2 GHz. Accordingly, the phase locked loop can not operate stably, for the reason described above.

SUMMARY OF THE INVENTION

Accordingly, it is an object of this invention to provide an improved phase controlled oscillator capable of stably pulling into synchronism in the frequency changing range of a voltage controlled oscillator even when the holding-in range of a phase locked loop is narrower than the frequency changing range of the voltage controlled oscillator.

According to this invention, there is provided a phase controlled oscillator of the type comprising a voltage controlled oscillator, a reference oscillator, a phase comparator supplied with output signals of both of the oscillators, a loop amplifier amplifying an output signal of the phase comparator and means for supplying an output signal of the loop amplifier to a control input terminal of the voltage controlled oscillator to form a phase synchronized loop or a phase locked loop, wherein there are provided a first sweeping oscillator, an output voltage thereof being controllable with a control input signal, the first sweeping oscillator generating a first sweeping signal in a limited output voltage amplitude range for supplying the first sweeping signal to the control input terminal of the voltage controlled oscillator, a second sweeping oscillator generating a second sweeping signal having an output amplitude smaller than that of the oscillator when the phase locked loop is in an asynchronous state, means for applying the second sweeping signal to the phase locked loop, the second sweeping oscillator stopping its oscillation when the phase synchronized loop becomes a synchronous or locked stae, and a control circuit which detects stoppage of oscillation of the second sweeping oscillator to hold an output voltage of the first sweeping oscillator.

BRIEF DESCRIPTION OF THE DRAWINGS

In the accompanying drawings:

FIG. 1 is a block diagram showing one embodiment of the phase controlled oscillator according to this invention; and FIGS. 2, 3 and 4 are block diagrams showing modified embodiments of this invention.

DESCRIPTION OF THE PREFERRED EMBODIMENTS

Figure 4:
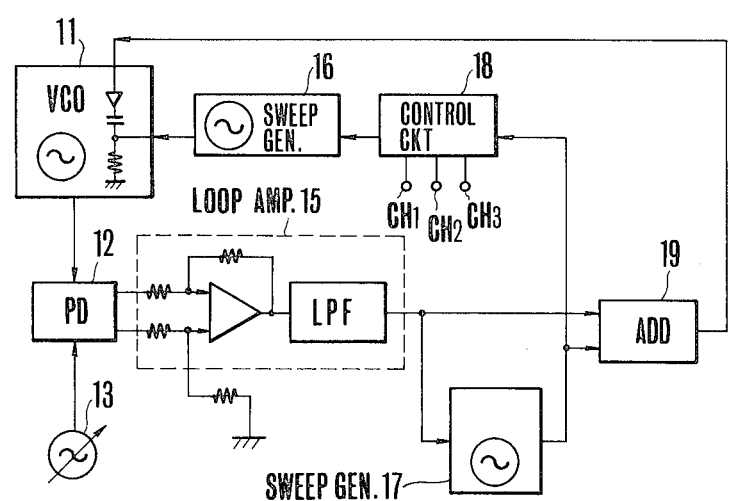

A phase controlled oscillator 10 embodying the invention and shown in FIG. 1 comprises a free running type voltage controlled oscillator 11 having a varactor diode 11a and the oscillation frequency of the oscillator 11 is controlled by an external control input signal applied thereto. The construction and operation of the voltage controlled oscillator is well known in the art. The output of the voltage controlled oscillator 11 is applied to one input terminal of a well known phase detector or a phase comparator 12 with its other input terminal supplied with the output of a reference oscillator 13. The phase detector 12 compares the phases of two input signals to apply to a well known loop amplifier 15 its difference output voltage proportional to the difference. As the phase detector 12 may be used any well known phase detector such as a phase discriminator, a product detector and a phase comparator utilizing a digital circuit.

As is well known in the art, the loop amplifier 15 comprises an operational amplifier 15a, several resistors 15b and to 15d and a low pass filter 15g which functions to eliminate noise and high frequency components in the output signal from the phase detector 12 and to determine the pull-in ranges and can be constituted by such filters as a primary lagging filter, lagging/leading filter and an active RC filter. The performance of the low pass filter can be provided by adding a feedback capacitance to the operational amplifier. The output of a sweeping oscillator 16 is applied to the non-inverted input terminal of the operational amplifier 15a of the loop amplifier 15. In this case, a signal having a polarity opposite to that of the non-inverted input terminal may be applied to the inverted input terminal of the operational amplifier.

The output of the loop amplifier 15, that is the output of the operational amplifier 15a passed through the low pass filter 15g is applied to the input of another sweeping oscillator 17, whose output is applied to a control circuit 18. The outputs of the loop amplifier 15 and the sweeping oscillator 17 are added together by an adder 19 and the sum is applied to the control input terminal of the voltage controlled oscillator 11 whose output frequency is utilized as the output of the phase controlled oscillator.

In the control circuit 18, the output of the sweeping oscillator 17 is rectified by rectifier 18a into a DC voltage which is compared with a reference value $V_P$ in a comparator 18. Where the output of the rectifier 18a is larger than the reference level $V_P$, the comparator 18b supplies a high level output to the sweeping oscillator 16 for triggering the same. On the contrary, where the output of the rectifier 18a is smaller than the reference value, the comparator 18b applies a low level output to the sweeping oscillator 16 to stop its oscillation. Thus, the control circuit 18 controls the oscillation of the sweeping oscillator 16. Further, the control circuit 18 is provided with a selector 18c that controls the center voltage of the output of the sweeping oscillator 16. In this example, reference voltages V1, V2, and V3 at the center of the output voltages of the sweeping oscillator 16 are used. For example, any one of the reference voltages is selected according to a channel selection signal supplied from outside corresponding to a channel to be used and then supplied to the oscillator 16.

As above described, the output voltage of the sweeping oscillator 16 can be controlled by the control input and the oscillator produces a sweeping wave in a limited voltage amplitude having triangular or sinusoidal waveform. The frequency of the output voltage is relatively low, of the order of several Hz to 10 Hz. The amplitude of the output voltage of the sweeping oscillator 16 is limited by the hold-in range of the phase locked loop (phase synchronized loop) or the characteristics of the phase comparator 12.

FIG. 1 shows the principle of one example of the sweeping oscillator 16. Thus, it comprises a source of oscillator 16a, a switch 16b which ON/OFF controls the output of the source of oscillation in accordance with the output of the comparator 18b, and an operational amplifier 16d coupled with the switch 16b through a coupling capacitor 16c. The operational amplifier 16d is combined with a number of resistors as is well known in the art and its non-inverted input terminal is supplied with an output of the control circuit 18 selected by the selector 18c, that is the center voltage to superpose it upon the output of the oscillator 16a. Thus, the superposed voltage is applied to the non-inverted input terminal of the loop amplifier 15 through a resistor 16e. The purpose of controlling the center voltage of the sweeping oscillator 16 is to cause the phase detector to always operate near the center of its operating characteristic.

Where the operation of the voltage controlled oscillator of a microwave band is stabilized with a quartz oscillator, and when a sampling phase detector is used as the phase detector, it is necessary to limit the amplitude for the reason as follows. More particularly, since the sampling phase detector is sampling, when n (an integer) times of the frequency of the quartz oscillator (usually, 50 to 100 MHz) coincides with the frequency of the voltage controlled oscillator, phases are compared. In other words, the points at which the phases are compared are numerous, among which (n−1) times and (n+1) times are chosen n times so that unless the amplitude of the oscillator 16 is limited, the frequency would be locked to (n−1) or (n+1) times.

When the phase locked loop becomes asynchronous and the loop amplifier 15 produces an output, the sweeping oscillator 17 receives this output and begins to oscillate by amplifying the input. When the phase locked loop is in a locked or synchronous state, the loop amplifier 15 does not produce any output so that it is constituted by an amplifier with its input/output phases set so as not to oscillate when the loop amplifier 15 does not produce an output. The sweeping oscillator 17 oscillates at a frequency lower than the response frequency of the phase locked loop, and generates a sine wave having a frequency of several to several hundred Hz.

The amplitude of the output of the sweeping oscillator 17 is set to be smaller than that of the output of the other sweeping oscillator 16, while its output frequency is set to be high as above described. The control circuit 18 detects the output of the sweeping oscillator 17 to stop the oscillation thereof and also to stop the oscillation of the sweeping oscillator 16 via the control circuit 18. The control circuit 18 further designates the output center voltage of the sweeping oscillator 16 such that an optimum offset voltage would be added to the output voltage of the loop amplifier 15.

When the circuit is constructed as above described, the sweeping oscillator 16 sweeps with a large amplitude by offsetting the output voltage of the loop amplifier into the hole-in range of the phase locked loop while the sweeping oscillator 17 sweeps finely.

When the phase locked loop once becomes synchronized a signal having an opposite phase with respect to the output appears on the input of the sweeping oscillator 17 by the response of the loop so that the oscillator 17 stops its oscillation. Accordingly, the output of the control circuit 18 becomes small or substantially zero so that the sweeping oscillator 16 also stops oscillation, and the output voltage at that time is held to complete pull-in to reach synchronism.

As above described, according to this invention, even when the hold-in range of the phase locked loop is narrower than the frequency changing range of the voltage controlled oscillator, a phase controlled oscillator can be obtained that can stably pull into synchronism in the frequency changing range of the voltage controlled oscillator.

As a consequence, even when the frequency range employed is wider than the range determined by the modulation sensitivity of the voltage controlled oscillator, for example, of the phase locked loop, the demodulation sensitivity of the phase detector or the DC gain of the loop amplifier, it is possible to offset the control input of the voltage controlled oscillator thereby automatically holding-in or locking by offsetting the control input to the voltage controlled oscillator by circuit elements 16, 17 and 18. According to this invention it is possible to automatically render the circuit into the hold-in or locked state. Even where multichannels having different frequency bands as a transponder are required to operate stably, when the channels are switched, the center voltage of the oscillator 16 is selected by the selector 18c so as to automatically execute offset processing corresponding to the frequencies of individual channels. As a consequence, the hold-in ranges of respective channels become substantially the same thereby uniformly performing more stable operation.

FIG. 2 is a block diagram showing a second embodiment of this invention. In this embodiment, the output of a loop amplifier 15 and the control voltage of a sweeping oscillator 17 are applied across a varactor diode provided for the purpose of controlling the frequency of a voltage controlled oscilator 11. With this construction, adder 19 shown in FIG. 1 can be omitted. The operation of this modification is similar to that of the first embodiment except that since in this modification, as the input signal to the sweeping oscillator 17 is in phase with the output signal, the input signal must be applied to the inverting input terminal of the sweeping oscillator 17.

FIG. 3 is a block diagram showing a third embodiment of this invention. In this embodiment, instead of sweeping the output offset voltage of the loop amplifier 15 with the output of the sweeping oscillator 16, there are provided two frequency control diodes, one of which is supplied with the control voltage of the phase locked loop while the other is supplied with the output voltage of the sweeping oscillator 16.

This construction enables to offset the self running frequency of the voltage controlled oscillator into a hold-in range so as to cause the circuit to operate in the same manner as the circuit shown in FIG. 1. A voltage controlled oscillator utilizing two varactor diodes is shown in U.S. Pat. No. 3,571,754 issued on Mar. 23, 1971, for example.

FIG. 4 is a block diagram showing a fourth embodiment of this invention having similar construction as that shown in FIG. 3 but is characterized in that the voltage controlled oscillator 11 utilizes only one control varactor diode and that the outputs of adder 19 and the sweeping oscillator 16 are applied across the control varactor diode. The modification operates in the same manner as that shown in FIG. 3.

It should be understood that the invention is not limited to the specific embodiments illustrated above, and that many changes and modifications will be obvious to one skilled in the art without departing from the true spirit and scope of the invention as defined in the appended claims.

What is claimed is:

1. In a phase controlled oscillator of the type comprising a voltage controlled oscillator, a reference oscillator, a phase comparator supplied with output signals of both of said oscillators, a loop amplifier for amplifying an output signal of said phase comparator and means for applying an output signal of said loop amplifier to a control input termial of said voltage controlled oscillator to form a phase locked loop, the improvement comprising a first sweeping oscillator having an output voltage, a control input signal for controlling said oscillator voltage, said first sweeping oscillator connected to the control input terminal of said voltage controlled oscillator and wherein said first sweeping oscillator generates a first sweeping signal in a limited output voltage range; a second sweeping oscillator which generates a second sweeping signal having an output amplitude smaller than that of said first sweeping oscillator when said phase locked loop is in a non-locked state, means for applying said second sweeping signal to said phase locked loop, wherein said second sweeping oscillator stops its oscillation when said phase locked loop is in a locked state; and a control circuit which detects stoppage of oscillation of said second sweeping oscillator to hold the output voltage of said first sweeping oscillator at a predetermined voltage.

2. The phase controlled oscillator according to claim 1 wherein said second sweeping oscillator is supplied with an output signal of said loop amplifier.

3. The phase controlled oscillator according to claim 1 wherein said second sweeping oscillator is supplied with an output signal of said loop amplifier, and said output signal of said second sweeping oscillator is applied to an adder in said loop together with an output of said loop amplifier.

4. The phase controlled oscillator according to claim 1 wherein the output signal of said loop amplifier and the output signal of said second sweeping oscillator are applied across a varactor diode element contained in said voltage controlled oscillator for controlling an oscillation condition thereof.

5. The phase controlled oscillator according to claim 1 wherein said second sweeping oscillator is supplied with the output signal of said loop amplifier, and the output signal of said second sweeping oscillator is supplied to an adder in said phase locked loop together with the output signal of said loop amplifier, and wherein an output of said adder and the output of said first sweeping oscillator are applied to said voltage cotrolled oscillator as control input signals.

6. The phase controlled oscillator according to claim 5 wherein said voltage controlled oscillator includes two varactor diodes, one of said varactor diodes being supplied with an output of the adder, while the other is supplied with the output signal of said first sweeping oscillator.

7. The phase controlled oscillator according to claim 5 wherein said voltage controlled oscillator includes a varactor diode, and wherein the outputs of said adder and said first sweeping oscillator are applied across said varactor diode.

8. The phase controlled oscillator according to claim 1 wherein the output frequency of said second sweeping oscillator is higher than that of said first sweeping oscillator.

9. The phase controlled oscillator according to claim 1 wherein said control circuit further includes means connected to said first sweeping oscillator for selectively providing an output center voltage of said first sweeping oscillator in accordance with a channel to be used.

* * * * *

UNITED STATES PATENT AND TRADEMARK OFFICE
CERTIFICATE OF CORRECTION

PATENT NO. : 4,486,717

DATED : December 4, 1984

INVENTOR(S) : Toyosaka Yamasaki

It is certified that error appears in the above-identified patent and that said Letters Patent is hereby corrected as shown below:

Column 2, line 19, "stae" should read -- state --.

Column 2, line 55, delete "and", first occurrence.

Column 4, line 32, delete "hole-in" and insert -- hold-in --.

Signed and Sealed this

Nineteenth Day of January, 1988

Attest:

DONALD J. QUIGG

*Attesting Officer*   *Commissioner of Patents and Trademarks*